United States Patent [19]
Sato et al.

[11] Patent Number: 5,312,698
[45] Date of Patent: May 17, 1994

[54] ALUMINUM NITRIDE SUBSTRATE AND METHOD FOR PRODUCING SAME

[75] Inventors: Hideki Sato; Yasuyuki Sugiura, both of Kanagawa, Japan

[73] Assignee: Kabushiki Kaisha Toshiba, Kawasaki, Japan

[21] Appl. No.: 104,564

[22] Filed: Aug. 11, 1993

Related U.S. Application Data

[60] Division of Ser. No. 825,799, Jan. 21, 1992, Pat. No. 5,258,218, which is a continuation of Ser. No. 406,416, Sep. 13, 1989, abandoned.

[30] Foreign Application Priority Data

Sep. 13, 1988 [JP] Japan ............................. 63-229400

[51] Int. Cl.$^5$ ............................................. C04B 41/51
[52] U.S. Cl. .................................... 428/698; 174/255; 174/256; 174/258; 428/469; 428/472; 428/697; 428/701; 428/702; 428/901
[58] Field of Search ............... 428/698, 469, 472, 697, 428/701, 901, 702; 174/255, 256, 258

[56] References Cited

U.S. PATENT DOCUMENTS

| | | | |
|---|---|---|---|
| 4,659,611 | 4/1987 | Iwase et al. | 428/209 |
| 4,756,976 | 7/1988 | Komeya et al. | 428/698 |
| 4,761,345 | 8/1988 | Sato et al. | 357/80 |
| 4,863,658 | 9/1989 | Sugiura et al. | 264/65 |

Primary Examiner—A. A. Turner
Attorney, Agent, or Firm—Foley & Lardner

[57] ABSTRACT

This invention is directed to a laser-subdivided aluminum nitride substrate wherein a resolidified layer formed at the laser score lines is constituted by one or more types of material selected from the group consisting of oxides, nitrides and oxynitrides of aluminum and of additives of said aluminum nitride substrate, and to a method of producing an aluminum nitride substrate wherein, subsequent to laser scoring the substrate, a heat treatment step at about 1000° C. to 1800° C. is carried out prior to the step of metallizing. This simple method provides an aluminum nitride substrate having a prescribed withstand-voltage characteristic.

10 Claims, 7 Drawing Sheets

ALUMINUM NITRIDE SUBSTRATE AND METHOD FOR PRODUCING SAME This application is a divisional of application Ser. No. 07/825,799, filed Jan. 21, 1992, now U.S. Pat. No. 5,258,218 which is a continuation of application Ser. No. 07/406,416 filed Sep. 13, 1989 now abandoned.

BACKGROUND OF THE INVENTION

This invention relates to an aluminum nitride substrate and to a method for producing it.

The field of applicability of ceramics has increased in recent years, and electronic components have come to occupy an important position within it. Semiconductor substrates have become an important application. In fact, notwithstanding its recent development to the stage of practical implementation, the technology of applying aluminum nitride ceramics as semiconductor element substrates is still the subject of vigorous research concerning detailed aspects thereof.

One of them is a method of producing many products at the same time. A mass-production method for aluminum nitride ceramics has been considered. There are many uses for the substrate. For purposes of illustration, however, a semiconductor substrate which has a size of 10 mm×10 mm×0.7 mm will be discussed.

A method of producing semiconductor substrates includes several steps of preparing a ceramic substrate, metallizing onto the substrate, electroless-plating onto the metallized portion, mounting a silicon semiconductor chip thereon, electrically connecting the chip with the electroless-plated portion through bonding wires, covering the substrate with resin, and installation into a product of transistor modules. It has been noticed that it is not advantageous to treat substrates one by one according to these steps. This is because the substrates are too small to be treated in these steps. Separate processing results in a ratio of good products to total products that becomes worse as the substrates become smaller.

A method has been developed for using a large ceramic substrate. That is, the method includes several steps of preparing a large ceramic substrate, metallizing many patterns onto the substrate, electroless-plating onto the metallized portions, sub-dividing the substrate into prescribed dimensions, mounting silicon semiconductor chips thereon, respectively, electrically connecting each chip with the electroless-plated portion through bonding wires, covering the substrate with resin, and installation into products of transistor modules. In this case, a high density energy means was used only by the applicant of the present invention for sub-dividing the substrate into prescribed dimensions. For example, there are laser method and electron beam means etc. as a high density energy means. In this case, laser method is better as a high density energy means because its equipment is simpler and cheaper than that of electron beam means. This method of using a laser has two steps, namely, making some holes, consecutive holes or grooves (hereinafter, these are called score lines) on the substrate by directing the laser at prescribed portions on the substrate, and severing the substrate along these score lines after the step of electroless-plating.

When score lines are formed in this way on an aluminum nitride substrate surface by high density energy working, the phenomenon of segregation of metallic aluminum in the vicinity of this worked surface has been found to occur. It is therefore found that, in the nickel plating stage, in which the substrate is covered with a metallizing layer constituting the electrically conductive layer necessary for an electronic component, the plating layer also covers the metallic layer that is present in the worked surface. This impairs the withstand-voltage characteristic that is required for a substrate to be used for electronic components.

Several methods have been developed for removing this metallic aluminum by the applicant of the present invention. They employ mechanical means in a honing step, using so-called abrasive etc., or placing it in water and irradiating with a laser. However, in the case of the former method, it is difficult to verify whether or not removal is complete. And in the latter method, the drawback that complicated system is required cannot be avoided.

SUMMARY OF THE INVENTION

It is therefore an object of the present invention to overcome the drawbacks according to the existing practices for producing aluminum nitride substrates.

Another object of this invention is to provide an aluminum nitride substrate having a prescribed withstand-voltage characteristic by means of a simple method.

It is also an object of the invention to provide an improved method for producing an aluminum nitride substrate.

A still further object of the invention is to provide a semiconductor device having a semiconductor circuit mounted on the improved substrate according to the invention.

In accomplishing the foregoing objects, there is provided according to one aspect of the present invention an aluminum nitride substrate having a high density energy means-generated score line in at least one portion thereof, the substrate having a re-solidified layer in the vicinity of the score line comprised of at least one material selected from the group consisting of an oxide, nitride or oxynitride of aluminum and an oxide, nitride or oxynitride of an additive of the aluminum nitride substrate.

In accordance with another aspect of the present invention, there is provided a method for producing an aluminum nitride substrate, comprising the steps of producing a high density energy means score line in at least one portion of an aluminum nitride substrate, thereby generating metallic aluminum in the vicinity of the score line; heating the scored substrate at a temperature of between about 1000° C. and 1800° C.; and thereafter metallizing the substrate that has been subjected to the heating step.

According to yet another aspect of the invention, there has been provided a semiconductor device comprising an insulating substrate and a semiconductor circuit mounted thereon, wherein the substrate comprises an aluminum nitride substrate as defined above.

Further objects, features and advantages of the invention will become apparent from the description of preferred embodiments that follows.

DETAILED DESCRIPTION OF THE PREFERRED EMBODIMENTS

This invention is directed to an aluminum nitride substrate wherein a re-solidified layer that is formed at the high density energy means worked surface of the aluminum nitride substrate is constituted by one or more types of material selected form the group consisting of oxides, nitrides and oxynitrides of aluminum and of additives of said aluminum nitride substrate. For example, there are Y and/or Ca as additive of AlN.

The method of the invention is characterized in that a subsequent heat treatment step at about 1000° C. to 1800° C. is conducted prior to a step of metallizing.

Although the aluminum nitride substrate according to this invention includes substrates wherein a high density energy working is used in a score line formation step, a through hole formation step and/or a severing step, the description will be concerned mainly with the formation of score lines, by way of example.

As described above, a metallic Al component is formed in the vicinity of the high density energy means working that is carried out prior to shaping the aluminum nitride substrate to the prescribed dimensions. However, this metallic constituent can be nullified, and a re-solidified layer constituted by one or more types of material selected from the group consisting of oxides, nitrides and oxynitrides of aluminum and of additives of the aluminum nitride substrate can be obtained, by performing a subsequent heat treatment step at about 1000° C. to 1800° C. In this case, an atmosphere of air or an atmosphere of nitrogen is preferred.

Figure 1:
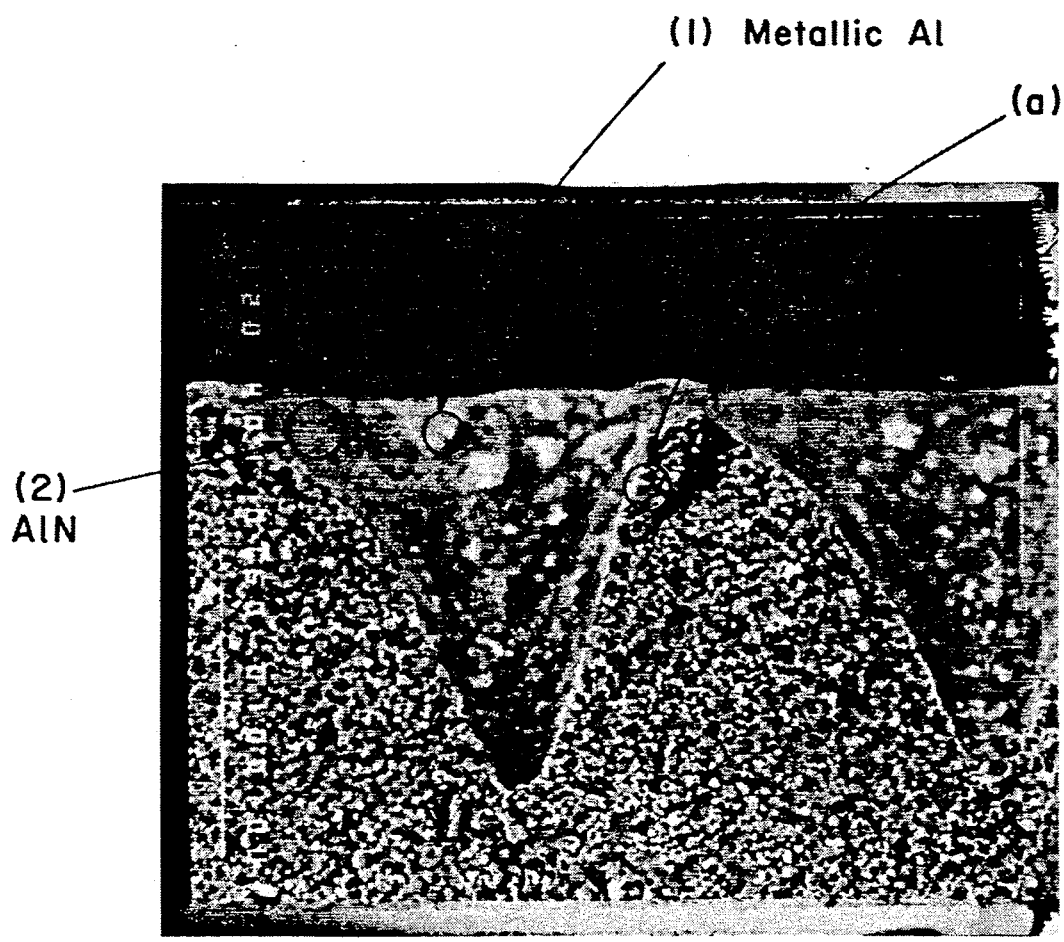
FIG. 1 is a electron photomicrograph showing a sectional view of an aluminum nitride substrate after laser score line formation in the aluminum nitride.
Figure 6A:
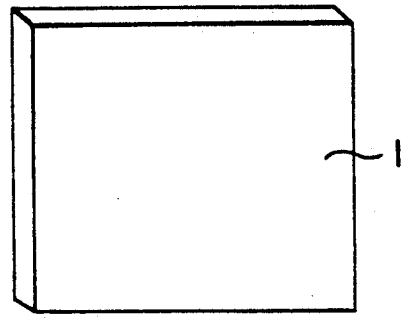
FIG. 6a is a perspective view of an aluminum nitride substrate.
Figure 6B:
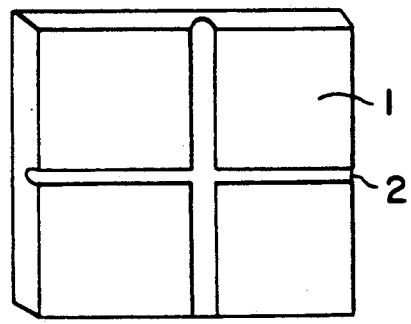
FIG. 6b is a perspective view showing the condition in which a score line is formed on the aluminum nitride substrate (in this case, score lines are illustrated as grooves).

FIG. 1 shows a photograph, obtained using an electron microscope at 400× magnification, of the cross-section after carrying out the step of forming score lines by laser working, as described above. The cross-section of the holes made with the laser is roughly of inverted triangular shape, and they have a depth of a little bit less than one third the thickness of the aluminum nitride substrate. As shown in FIG. 6b, this photograph was taken along the break position along the scribe line 2 (consecutive holes), formed in an aluminum nitride substrate 1. There are several shining portions (ex part (1) in FIG. 1) on the surface of the holes. These are composed of metallic aluminum. In this case, "YAG" laser is used in the condition of a peak power (10Kw).

Figure 2:
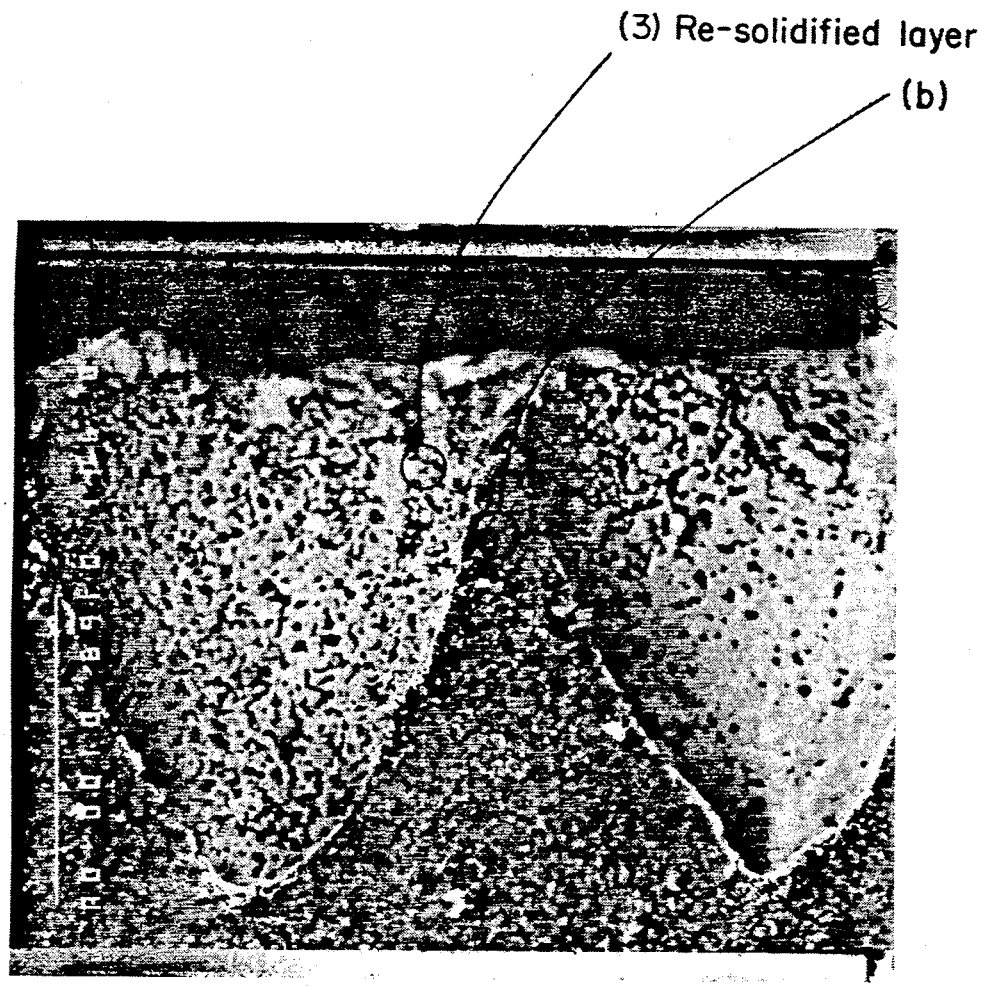
FIG. 2 is a electron photomicrograph showing a sectional view of an aluminum nitride substrate according to this invention after heating the laser score line formation in the aluminum nitride at 1600° C.

FIG. 2 shows a photograph, obtained using an electron microscope at 400× magnification, of the cross-section of an aluminum nitride substrate according to this invention after heating the laser score line formation in the aluminum nitride at about 1600° C. As in FIG. 2, metallic Al disappeared on the surfaces of the holes. Although there are some shining portions on the surfaces of the holes, these portions are some parts of re-solidified layer (ex part (3) in FIG. 2). Also, grain boundaries are clearly formed, and it is evident that they have a structure that differs somewhat from that of the surrounding aluminum nitride substrate.

Figure 3:
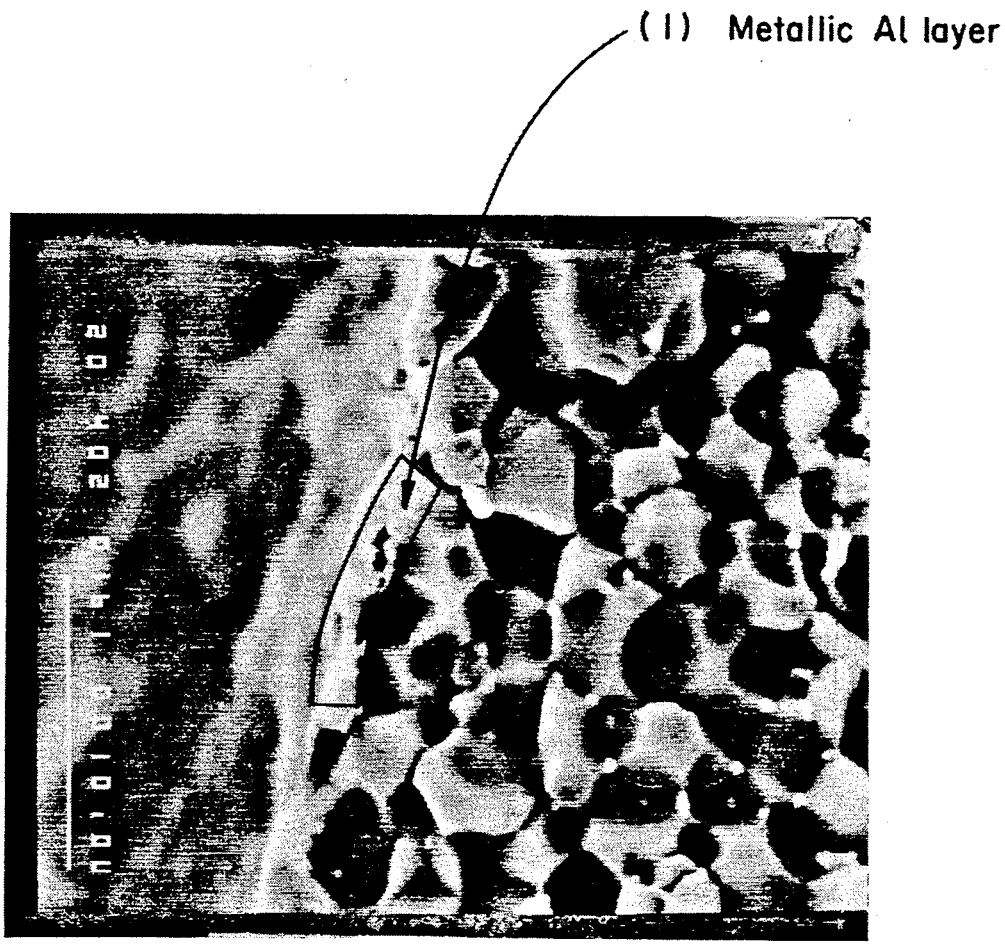
FIG. 3 is a electron photomicrograph showing a magnified sectional view of FIG. 1.

FIG. 3 is a electron photomicrograph taken with a magnification of 4000×, showing a sectional view of an aluminum nitride substrate after laser score line formation in the aluminum nitride. This picture is the part (a) in FIG. 1 magnified. From FIG. 3, it can be seen that the metallic component Al (part (1) in FIG. 3) is present, shining on the surface of a hole.

Figure 4:
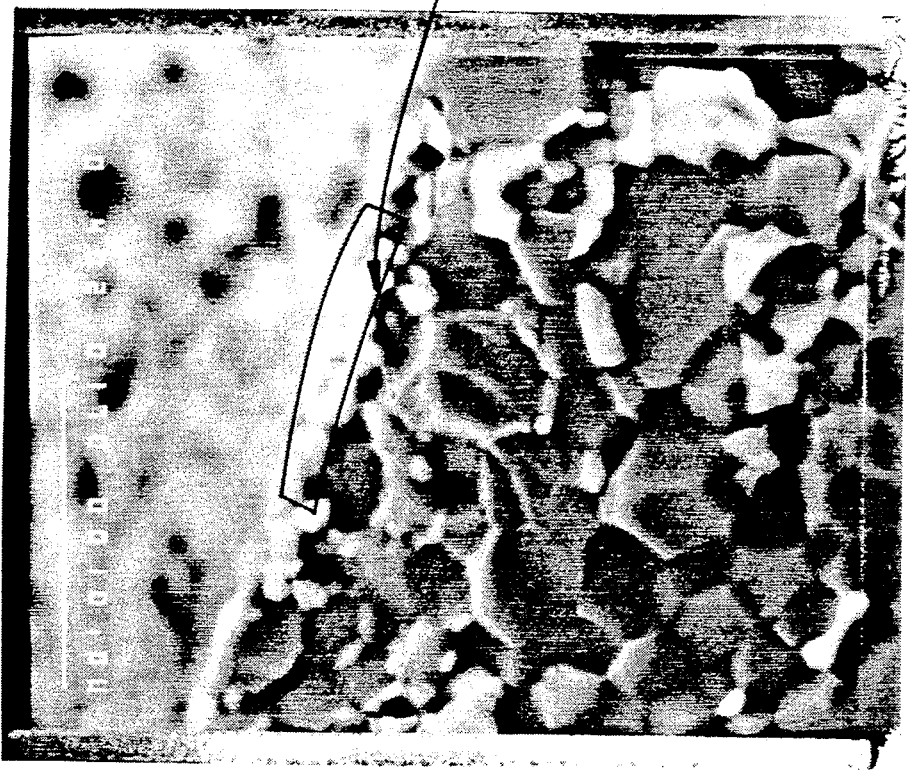
FIG. 4 is a electron photomicrograph showing a magnified sectional view of FIG. 2.

FIG. 4 is a electron photomicrograph taken with a magnification of 4000×, showing a sectional view of an aluminum nitride substrate according to this invention after heating the laser score line formation in the aluminum nitride at about 1600° C. This picture is the part (b) in FIG. 2 magnified. As seen in FIG. 4, a granular re-solidified layer grows adjacent the aluminum nitride structure of the bulk of the substrate. Its thickness is about 2 to 3 $\mu$m.

Figure 5A:
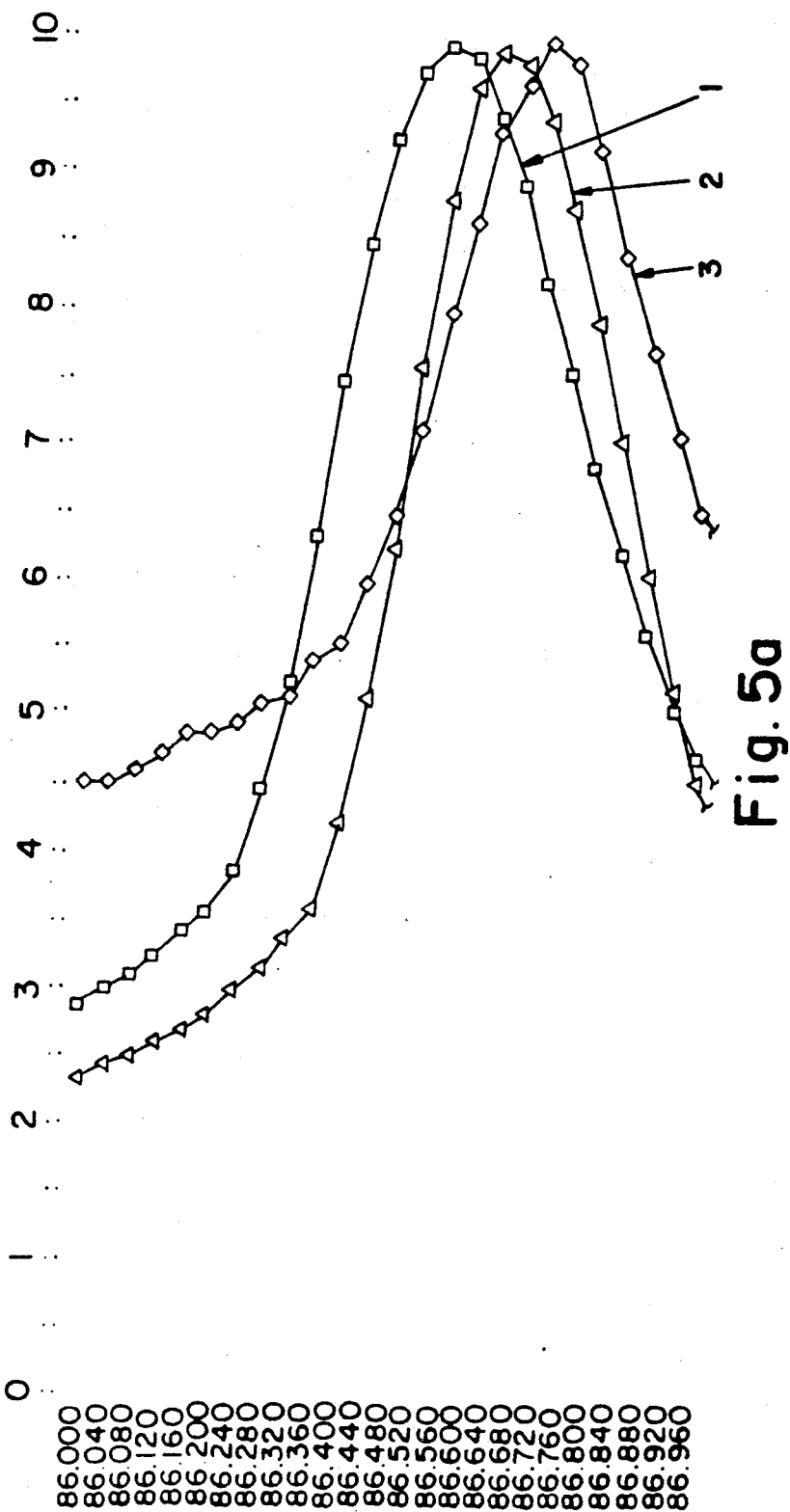
FIGS. 5A and 5B are is a graph taken with EPMA (Electron Probe Micro Analyzer), showing intensity along the vertical axis and the Al-K$\beta$ spectrum along the horizontal axis.
Figure 5B:
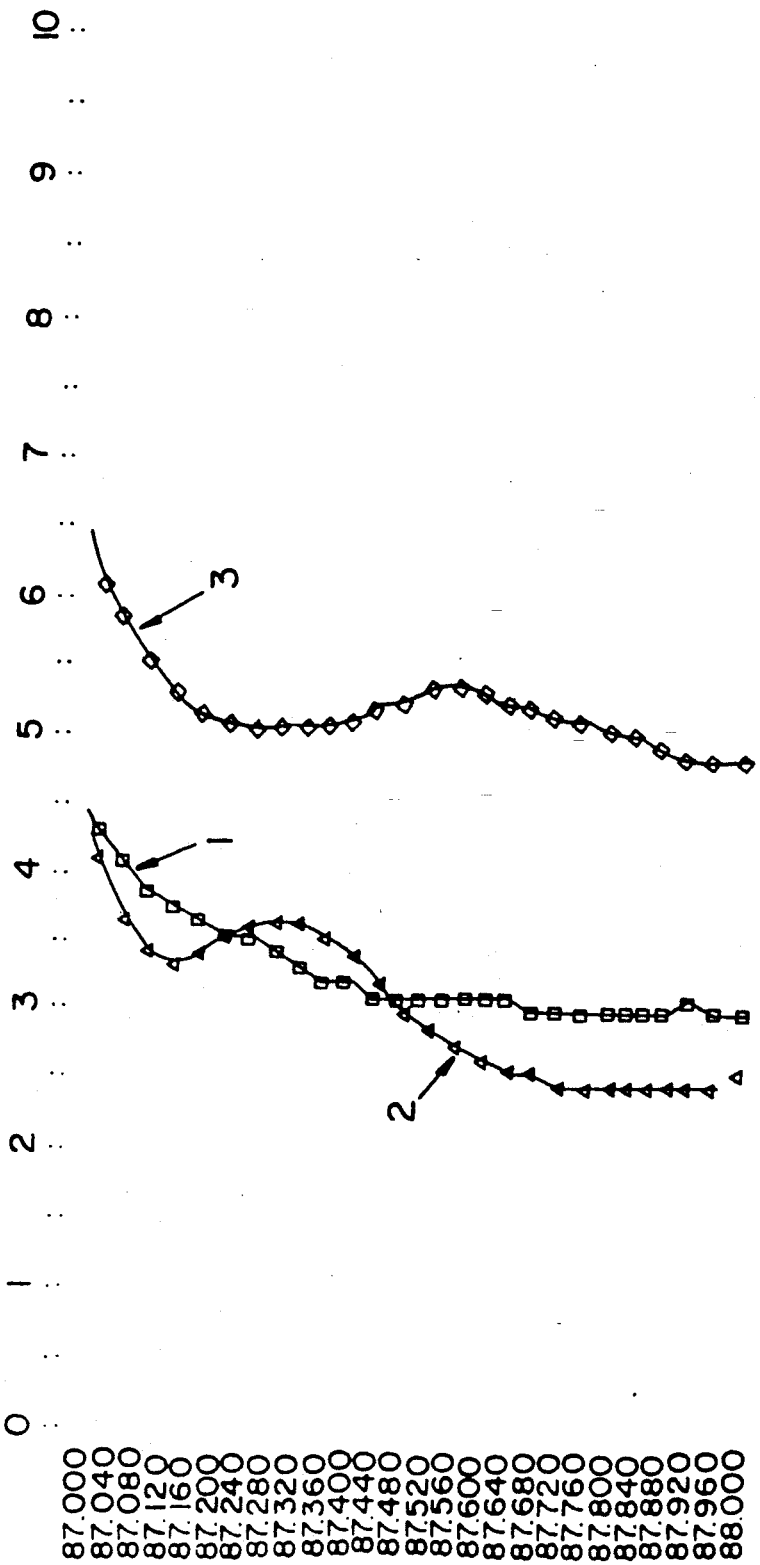

FIGS. 5A and 5B are a graph taken with EPMA (Electron Probe Micro Analyzer), showing intensity along the vertical axis and the Al-K$\beta$ spectrum along the horizontal axis. Curve 1 is the result of inspecting a shining portion on the surface of the hole in FIG. 1 (the part (1) in FIG. 1). Curve 2 is the result of inspecting a substrate of the aluminum nitride in FIG. 1 (the part (2) in FIG. 1). Curve 3 is the result of inspecting a shining portion on the surface of the hole in FIG. 2 (the part (3) in FIG. 2).

Curve 1 has a peak of 86.56. This peak represents metallic aluminum. Curve 2 has a peak of 86.64 and a swelling portion of about 87.28. This curve represents aluminum nitride. Curve 3 has a peak of 86.72 and a swelling portion of about 87.56. This curve represents oxides of aluminum and yttrium ($3Y_2O_3 \cdot 5Al_2O_3$). The yttrium content appearing in curve 3 is an additive of the aluminum nitride. That is, when a heat load is applied to a metallic layer formed at the score line, the metallic component disappears and an insulating component is obtained.

Thus, it is clear that the re-solidified layer formed at the laser-worked surface of the aluminum nitride substrate of this invention consists of oxides and nitrides of Al and of additives of the aluminum nitride substrate. Although not indicated in these experimental results, depending on the type of additive of the aluminum nitride substrate, its amount and the laser working conditions, oxynitrides may also be formed.

Owing to the formation at the laser-worked surface of an insulating re-solidified layer having the above-described special composition, an aluminum nitride substrate having the prescribed withstand-voltage characteristic can be obtained.

Figure 6C:
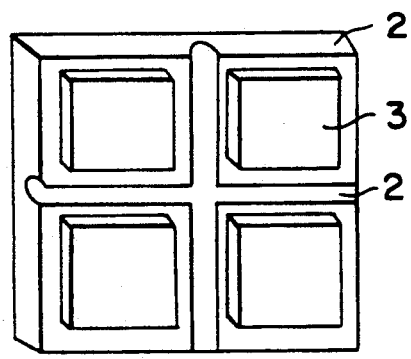
FIG. 6c is a perspective view showing the metallized pattern arranged on the divided aluminum nitride substrate.

An embodiment of this invention is described with reference to FIG. 6a, b and c. Specifically, as shown in FIG. 6a, an aluminum nitride substrate 1 is prepared having the following dimensions: thickness 0.635 mm×2 inches square, with thermal conductivity 130 W/mk. As shown in FIG. 6b, the front face is then worked to produce 1 inch squares using a laser. After this, it is held for 1 hour in a nitrogen atmosphere maintained at 1600° C., and the substrate is transferred to the subsequent patterning stage. In this patterning step, a metallized pattern 3 is arranged within the one inch squares defined by the score line 2 by, for example, screen printing a vehicle made of Mo, W, and a group 4A element (Ti, Zr and Hf) and compounds thereof such as TiO. Next, metallized pattern 3 is completed, as shown in FIG. 6c, by holding in a mixed atmosphere of nitrogen maintained at 1700° C. Next, metallized pattern 3 is covered with a Ni layer (not shown) of thickness 4 μm, by electroless-plating. After this, the substrate is severed along the score lines into 4 subdivided substrates. The subdivided substrates are inspected with a withstand-voltage test. As a result, the substrate exhibits an excellent withstand-voltage.

What is claimed is:

1. A semiconductor device, comprising an insulating substrate and a semiconductor circuit mounted on said substrate, wherein said substrate comprises an aluminum nitride substrate obtained by severing an initial aluminum nitride substrate along a high density energy means-generated score line for machining the substrate, having a predetermined depth in at least one portion thereof, said initial substrate comprising a re-solidified layer at the surface of said score line comprised of at least one material selected from the group consisting of an oxide, nitride or oxynitride of aluminum and an oxide, nitride or oxynitride of an additive of the aluminum nitride substrate, wherein said predetermined depth is greater than the thickness of said re-solidified layer.

2. A semiconductor device according to claim 1, wherein said high density energy means comprises a laser.

3. A semiconductor device according to claim 1, wherein said re-solidified layer comprises an oxide, nitride or oxynitride of aluminum.

4. A semiconductor device according to claim 1, wherein said initial substrate contains at least one additive comprising a metal compound, and said re-solidified layer comprises an oxide, nitride or oxynitride of said additive.

5. A semiconductor device according to claim 4, wherein said additive is selected from the group consisting of yttrium and calcium.

6. A semiconductor device according to claim 1, wherein said initial substrate is substantially free of metallic aluminum at the surface of said score line.

7. A semiconductor device according to claim 1, wherein said score line comprises at least one pattern selected from the group consisting of holes, consecutive holes and a groove.

8. A semiconductor device according to claim 1, wherein said re-solidified layer comprises an oxide of aluminum.

9. A semiconductor device according to claim 4, wherein said re-solidified layer comprises an oxide of said additive.

10. A semiconductor device according to claim 1, wherein said re-solidified layer is produced by heating the scored substrate at a temperature of between about 1000° C. and 1800° C. in an atmosphere of air or nitrogen, whereby metallic aluminum is converted into said material.

* * * * *